United States Patent
Choi et al.

(10) Patent No.: US 9,773,541 B1
(45) Date of Patent: Sep. 26, 2017

(54) SEMICONDUCTOR DEVICE AND SEMICONDUCTOR SYSTEM

(71) Applicant: SK hynix Inc., Icheon-si Gyeonggi-do (KR)

(72) Inventors: Geun Ho Choi, Icheon-si Gyeonggi-do (KR); Man Keun Kang, Seongnam-si Gyeonggi-do (KR); Myung Kyun Kwak, Yongin-si Gyeonggi-do (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/214,578

(22) Filed: Jul. 20, 2016

(30) Foreign Application Priority Data

May 18, 2016 (KR) .................. 10-2016-0061102

(51) Int. Cl.
*G11C 11/406* (2006.01)
*G11C 11/408* (2006.01)
*G11C 11/409* (2006.01)
*G11C 11/4093* (2006.01)

(52) U.S. Cl.
CPC .... *G11C 11/40615* (2013.01); *G11C 11/4085* (2013.01); *G11C 11/4093* (2013.01)

(58) Field of Classification Search
CPC .......... G11C 11/40615; G11C 11/4085; G11C 11/4093
See application file for complete search history.

(56) References Cited

U.S. PATENT DOCUMENTS

2014/0016423 A1    1/2014  Ware et al.
2017/0062038 A1*   3/2017  Doo ..................... G06F 13/1636

FOREIGN PATENT DOCUMENTS

KR       1020110109684 A    10/2011

* cited by examiner

*Primary Examiner* — Tri Hoang
(74) *Attorney, Agent, or Firm* — William Park & Associates Ltd.

(57) ABSTRACT

A semiconductor system includes a semiconductor device suitable for not performing an internal refresh operation when entering a self-refresh mode in response to a self-refresh command, and cutting off input of an auto-refresh command when exiting the self-refresh mode.

10 Claims, 8 Drawing Sheets

SEMICONDUCTOR DEVICE AND SEMICONDUCTOR SYSTEM

CROSS-REFERENCE TO RELATED APPLICATION

The present application claims priority under 35 U.S.C. §119(a) to Korean Patent Application No. 10-2016-0061102 filed on May 18, 2016 in the Korean Intellectual Property Office, which is incorporated herein by reference in its entirety.

BACKGROUND

1. Technical Field

Embodiments of the present disclosure relate to a semiconductor device capable of controlling a refresh operation and a semiconductor system.

2. Related Art

Among semiconductor devices, a DRAM (dynamic random access memory) has a characteristic such that information stored in memory cells of the DRAM disappear as time goes by, unlike an SRAM (static random access memory) or a flash memory. In order to prevent such a phenomenon, an operation of rewriting information stored in memory cells of the DRAM is performed from outside the DRAM within a predetermined period. Such an operation is referred to as a refresh. The refresh is performed in such a way as to activate each word line at least one time within a retention time of memory cells or the like and sense and amplify data. The retention time refers to a time during which data can be retained in a memory cell without a refresh after the data is written to the memory cell.

Meanwhile, the retention time of a memory cell is substantially changed depending upon a temperature of a semiconductor device. Therefore, it may be necessary to adjust operating conditions of circuit blocks of a semiconductor system, according to a change in the internal temperature of the semiconductor device. In order to adjust operating conditions according to a change of the internal temperature of a semiconductor system, temperature sensors such as a DTSR (digital temperature sensor regulator), an ATSR (analog temperature sensor regulator), and a TCSR (temperature compensated self-refresh).

SUMMARY

Various embodiments are directed to a semiconductor device capable of not performing an internal refresh operation when entering a self-refresh and cutting off input of a refresh command when exiting the self-refresh, and a semiconductor system.

In an embodiment, a semiconductor system may include: a semiconductor device suitable for not performing an internal refresh operation when entering a self-refresh mode in response to a self-refresh command, and cutting off input of an auto-refresh command when exiting the self-refresh mode.

In an embodiment, a semiconductor device may include: a refresh control circuit suitable for generating first and second counting signals in response to a self-refresh command and temperature information signals, and generating a masking signal which is enabled at a time point when the first counting signal is enabled.

According to the embodiments, an internal refresh operation is not performed when entering a self-refresh, and input of a refresh command is cut off when exiting the self-refresh. As a consequence, since an unnecessary refresh is not performed, a power consumption amount may be reduced.

DETAILED DESCRIPTION

Hereinafter, a semiconductor device and a semiconductor system will be described below with reference to the accompanying drawings through various example embodiments.

Figure 1:
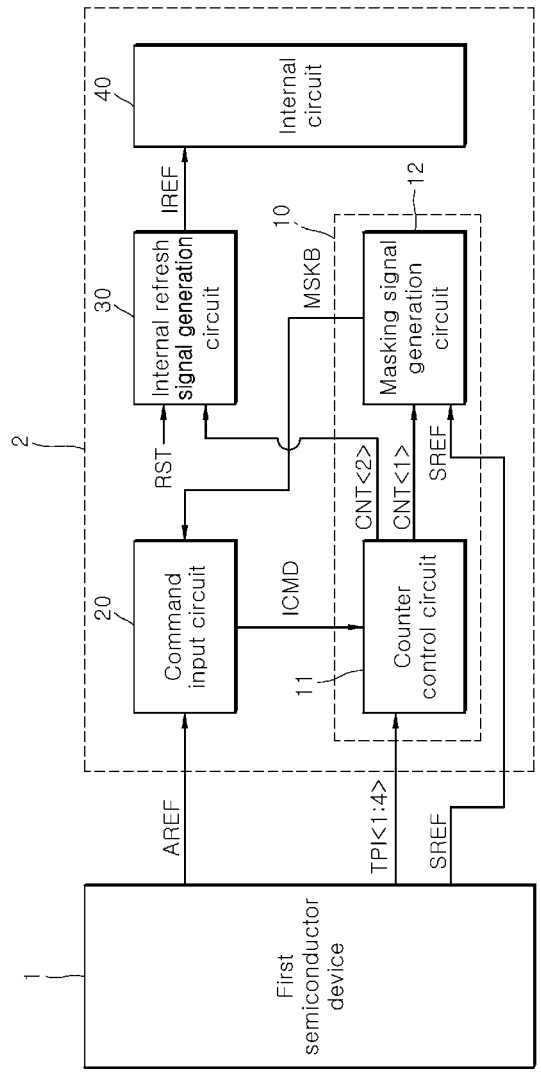
FIG. 1 is a block diagram illustrating a representation of an example configuration of a semiconductor system in accordance with an embodiment.

As shown in FIG. 1, a semiconductor system in accordance with an embodiment may include a first semiconductor device 1 and a second semiconductor device 2. The second semiconductor device 2 may include a refresh control circuit 10, a command input circuit 20, an internal refresh signal generation circuit 30, and an internal circuit 40.

The first semiconductor device 1 may output an auto-refresh command AREF, a self-refresh command SREF, and first to fourth temperature information signals TPI<1:4>. The auto-refresh command AREF is a command for entering an auto-refresh mode. The self-refresh command SREF is a command for entering a self-refresh mode. While each of the auto-refresh command AREF and the self-refresh command SREF is shown as one signal or command, it is to be noted that each of the auto-refresh command AREF and the self-refresh command SREF may be set as a combination of a plurality of commands, according to an embodiment. The first to fourth temperature information signals TPI<1:4> may be set as signals including the internal temperature information of the semiconductor system. While the first to fourth temperature information signals TPI<1:4> are shown as 4 bits, it is to be noted that in some embodiments the first to fourth temperature information signals TPI<1:4> may be realized by various numbers of bits to include internal temperature information.

The refresh control circuit 10 may include a counter control circuit 11 and a masking signal generation circuit 12.

The counter control circuit 11 may generate a first counting signal CNT<1> which is enabled after a first predetermined period from the input time of a reset signal RST, and the counter control circuit 11 may generate a second counting signal CNT<2> which is enabled after a second predetermined period from the input time of the reset signal RST. The counter control circuit 11 may generate the first counting signal CNT<1> and the second counting signal CNT<2> in response to the temperature information signals TPI<1:4> and an internal command ICMD. The first predetermined period and the second predetermined period will be described later in detail.

The masking signal generation circuit 12 may generate a masking signal MSKB which is disabled in response to the self-refresh command SREF and is enabled in response to the first counting signal CNT<1>. The masking signal MSKB may be set as a signal for cutting off input of the auto-refresh command AREF when exiting the self-refresh mode.

That is to say, the refresh control circuit 10 may generate the first counting signal CNT<1> which is enabled after the first predetermined period and generate the second counting signal CNT<2> which is enabled after the second predetermined period, in response to the temperature information signals TPI<1:4> and the self-refresh command SREF. The refresh control circuit 10 may generate the masking signal MSKB which is enabled at a time point when the first counting signal CNT<1> is enabled.

The command input circuit 20 may transfer the auto-refresh command AREF as the internal command ICMD or cut off input of the auto-refresh command AREF for a predetermined period in response to the masking signal MSKB. The command input circuit 20 may transfer the auto-refresh command AREF as the internal command ICMD if the masking signal MSKB is enabled. The command input circuit 20 may cut off input of the auto-refresh command AREF if the masking signal MSKB is disabled.

The internal refresh signal generation circuit 30 may generate an enabled internal refresh signal IREF in response to at least one of the reset signal RST and the second counting signal CNT<2>. The internal refresh signal generation circuit 30 may generate the enabled internal refresh signal IREF, if the reset signal RST is enabled. The internal refresh signal generation circuit 30 may generate the enabled internal refresh signal IREF, if the second counting signal CNT<2> is enabled.

The internal circuit 40 may perform an internal refresh operation or an auto-refresh operation in response to the internal refresh signal IREF. The internal circuit 40 may perform the internal refresh operation when entering the self-refresh mode. The internal circuit 40 may perform the auto-refresh operation when entering the auto-refresh mode. The internal refresh operation may involve an operation of sequentially refreshing a plurality of banks included in the internal circuit 40. The internal refresh operation may be set as a self-refresh operation. The auto-refresh operation may be set as an all-bank refresh operation for refreshing all the plurality of banks included in the internal circuit 40 or a per-bank refresh operation for refreshing only a partial region, according to an embodiment.

In other words, the second semiconductor device 2 cuts off input of the auto-refresh command AREF for the first predetermined period when exiting the self-refresh mode, and does not perform the internal refresh operation when entering the self-refresh mode in response to the self-refresh command SREF. The second semiconductor device 2 may perform an internal refresh operation after the second predetermined period when entering the self-refresh mode. The second semiconductor device 2 may be inputted with the auto-refresh command AREF and perform the auto-refresh operation after the first predetermined period when exiting the self-refresh mode.

Figure 2:
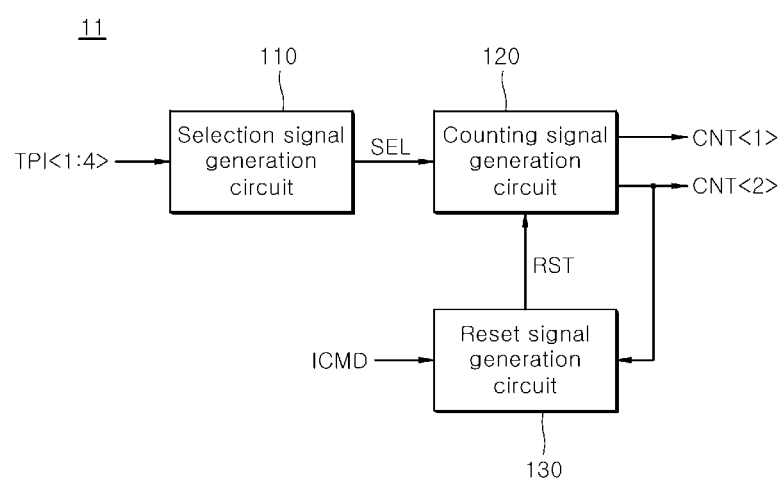
FIG. 2 is a block diagram illustrating a representation of an example internal configuration of a counter control circuit included in the semiconductor system shown in FIG. 1.

Referring to FIG. 2, the counter control circuit 11 in accordance with an embodiment may include a selection signal generation circuit 110, a counting signal generation circuit 120, and a reset signal generation circuit 130.

The selection signal generation circuit 110 may generate a selection signal SEL which is adjusted in a pulse generation period thereof according to the first to fourth temperature information signals TPI<1:4>. The selection signal generation circuit 110 may generate the selection signal SEL of which the pulse generation period is shortened if an internal temperature is a high temperature where the pulse generation period is shortened according to the combination of the first to fourth temperature information signals TPI<1:4>. The pulse generation period of the selection signal SEL may be adjusted in a variety of ways according to the combination of the first to fourth temperature information signals TPI<1:4>. According to an embodiment, the selection signal generation circuit 110 may include an oscillator which detects an internal temperature and generates the selection signal SEL which has a period that is adjusted according to a change in the internal temperature.

The counting signal generation circuit 120 may generate the first counting signal CNT<1> which is enabled after the first predetermined period from the input time of the reset signal RST, and the counting signal generation circuit 120 may generate the second counting signal CNT<2> which is enabled after the second predetermined period from the input time of the reset signal RST. The first counting signal CNT<1> and the second counting signal CNT<2> may be enabled in response to the selection signal SEL.

The reset signal generation circuit 130 may generate the reset signal RST which is enabled to a logic high level in response to the internal command ICMD or the second counting signal CNT<2>. The reset signal generation circuit 130 may generate the reset signal RST which is enabled to the logic high level in response to the internal command ICMD. The reset signal generation circuit 130 may generate the reset signal RST which is enabled to the logic high level in response to the second counting signal CNT<2>. A logic level to which the reset signal RST is enabled may be set variously depending upon an embodiment.

Figure 3:
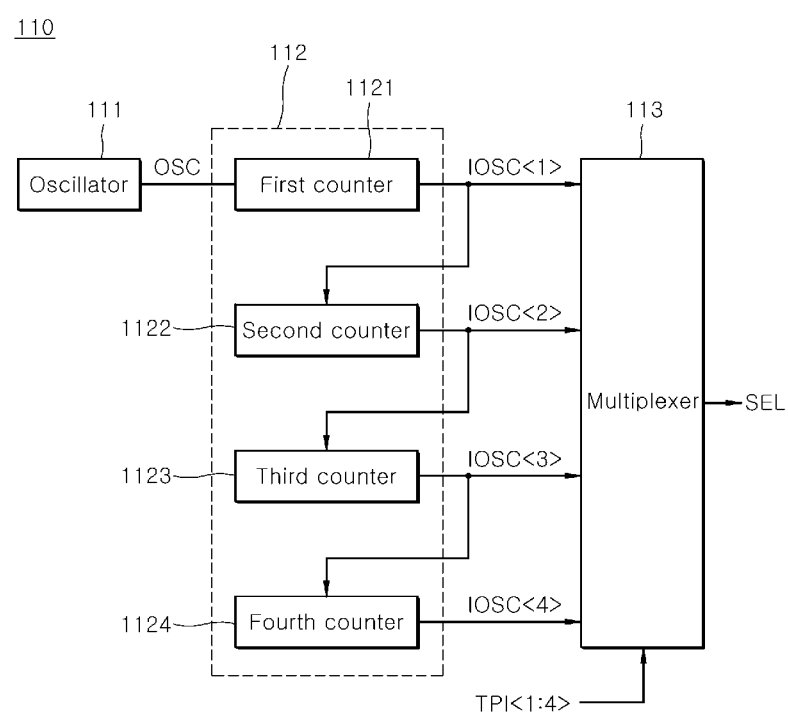
FIG. 3 is a block diagram illustrating a representation of an example internal configuration of a selection signal generation circuit included in the counter control circuit shown in FIG. 2.

Referring to FIG. 3, the selection signal generation circuit 110 in accordance with the embodiment may include an oscillator 111, an internal period signal generation circuit 112, and a multiplexer 113.

The oscillator 111 may generate a period signal OSC including a pulse which is generated periodically. The oscillator 111 may be realized by a ring oscillator and generate the period signal OSC including a pulse which is generated periodically.

The internal period signal generation circuit 112 may include a first counter 1121, a second counter 1122, a third counter 1123, and a fourth counter 1124. The internal period signal generation circuit 112 may generate first to fourth internal period signals IOSC<1:4> which have different frequencies, where the first to fourth internal period signals IOSC<1:4> are generated in response to the period signal OSC.

The first counter 1121 may generate a first internal period signal IOSC<1> which is counted in response to the pulse of the period signal OSC. The first counter 1121 may be realized by a counter generally known in the art and generate the first internal period signal IOSC<1> having a level which transitions at a time point when the pulse of the period signal OSC is inputted.

The second counter 1122 may generate a second internal period signal IOSC<2> which is counted in response to the pulse of the first internal period signal IOSC<1>. The second counter 1122 may be realized by a counter generally known in the art and generate the second internal period signal IOSC<2> which transitions in its level at a time point when the pulse of the first internal period signal IOSC<1> is inputted.

The third counter 1123 may generate a third internal period signal IOSC<3> which is counted in response to the pulse of the second internal period signal IOSC<2>. The third counter 1123 may be realized by a counter generally known in the art and generate the third internal period signal IOSC<3> which transitions in its level at a time point when the pulse of the second internal period signal IOSC<2> is inputted.

The fourth counter 1124 may generate a fourth internal period signal IOSC<4> which is counted in response to the pulse of the third internal period signal IOSC<3>. The fourth counter 1124 may be realized by a counter generally known in the art and generate the fourth internal period signal IOSC<4> which transitions in its level at a time point when the pulse of the third internal period signal IOSC<3> is inputted.

According to an embodiment, the first to fourth internal period signals IOSC<1:4> may be generated such that their pulse generation periods are sequentially increased or decreased. While the internal period signal generation circuit 112 is illustrated to include four counters for the sake of convenience of explanation, it is to be noted that the number of counters may be set variously depending upon an embodiment.

The multiplexer 113 may be realized by a multiplexer generally known in the art, and transfer any one of the first to fourth internal period signals IOSC<1:4> as the selection signal SEL in response to a combination of the first to fourth temperature information signals TPI<1:4>.

Figure 4:
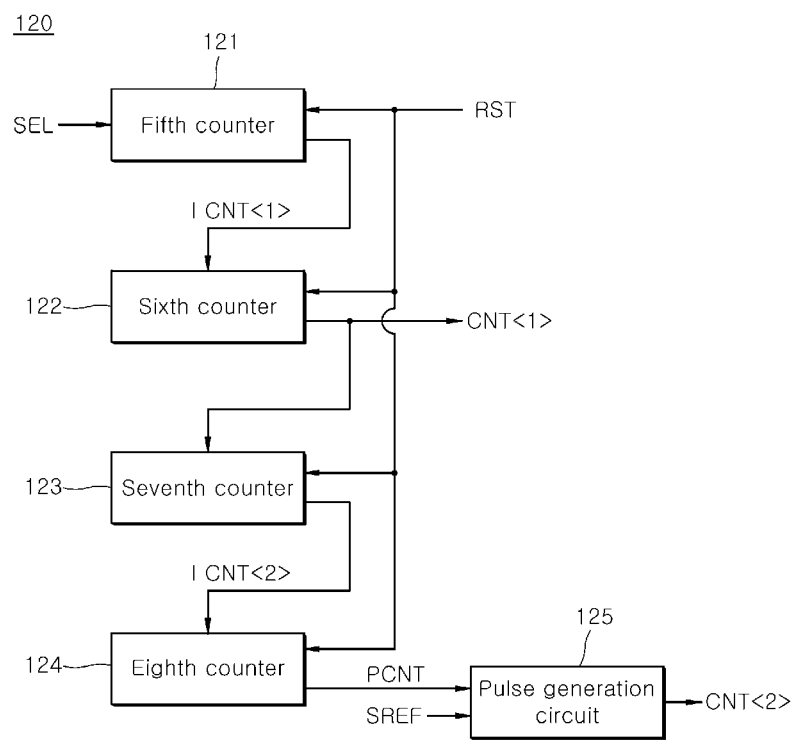
FIG. 4 is a block diagram illustrating a representation of an example internal configuration of a counting signal generation circuit included in the counter control circuit shown in FIG. 2.

Referring to FIG. 4, the counting signal generation circuit 120 in accordance with an embodiment may include a fifth counter 121, a sixth counter 122, a seventh counter 123, an eighth counter 124, and a pulse generation circuit 125.

The fifth counter 121 may generate a first internal counting signal ICNT<1> which is initialized in response to the reset signal RST and is counted in response to the pulse of the selection signal SEL. The fifth counter 121 may be realized by a counter generally known in the art and generate the first internal counting signal ICNT<1> which is initialized to a logic low level if the reset signal RST is inputted. The fifth counter 121 may generate the first internal counting signal ICNT<1> which transitions in its level at a time point when the pulse of the selection signal SEL is inputted to the fifth counter 121.

The sixth counter 122 may generate the first counting signal CNT<1> which is initialized in response to the reset signal RST and is counted in response to the pulse of the first internal counting signal ICNT<1>. The sixth counter 122 may be realized by a counter generally known in the art and generate the first counting signal CNT<1> which is initialized to a logic low level if the reset signal RST is inputted. The sixth counter 122 may generate the first counting signal CNT<1> which transitions in its level at a time point when the pulse of the first internal counting signal ICNT<1> is inputted to the sixth counter 122.

The seventh counter 123 may generate a second internal counting signal ICNT<2> which is initialized in response to the reset signal RST and is counted in response to the pulse of the first counting signal CNT<1>. The seventh counter 123 may be realized by a counter generally known in the art and generate the second internal counting signal ICNT<2> which is initialized to a logic low level if the reset signal RST is inputted. The seventh counter 123 may generate the second internal counting signal ICNT<2> which transitions in its level at a time point when the pulse of the first counting signal CNT<1> is inputted to the seventh counter 123.

The eighth counter 124 may generate a pre-counting signal PCNT which is initialized in response to the reset signal RST and is counted in response to the pulse of the second internal counting signal ICNT<2>. The eighth counter 124 may be realized by a counter generally known in the art and generate the pre-counting signal PCNT which is initialized to a logic low level if the reset signal RST is inputted. The eighth counter 124 may generate the pre-counting signal PCNT which transitions in its level when the pulse of the second internal counting signal ICNT<2> is inputted to the eighth counter 124.

While the counting signal generation circuit 120 is illustrated to include four counters for the sake of convenience in explanation, it is to be noted that the number of counters may be set variously depending upon an embodiment.

The first predetermined period described above may be set as a period from a time when the reset signal RST is inputted and the fifth and sixth counters 121 and 122 are initialized to a time when the first counting signal CNT<1> is enabled by the counting operations of the fifth and sixth counters 121 and 122. The second predetermined period may be set as a period from a time when the reset signal RST is inputted and the fifth to eighth counters 121, 122, 123 and 124 are initialized to a time when the pre-counting signal PCNT is enabled by the counting operations of the fifth to eighth counters 121, 122, 123 and 124. The first predetermined period may be set as a self-refresh operation period tREF. The second predetermined period may be set as an auto-refresh operation period tTCSR.

The pulse generation circuit 125 may generate the second counting signal CNT<2> which is enabled in response to the self-refresh command SREF and the pre-counting signal PCNT. The pulse generation circuit 125 may generate the second counting signal CNT<2> which is enabled to a logic high level, if the self-refresh command SREF is inputted at a logic high level and the pre-counting signal PCNT is inputted at a logic high level.

Figure 5:
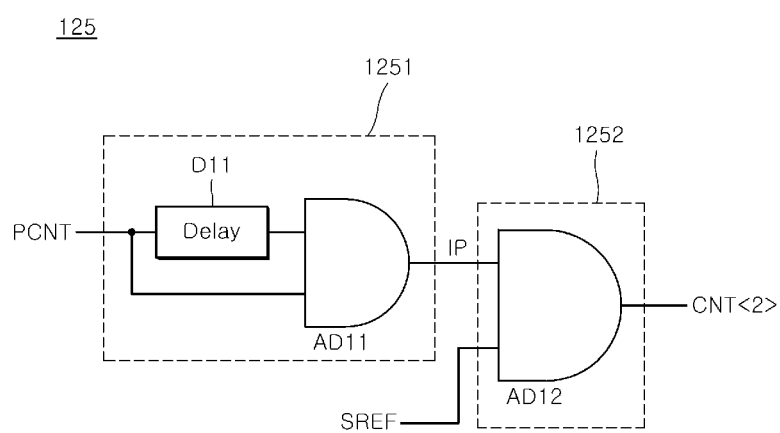
FIG. 5 is a block diagram illustrating a representation of an example internal configuration of a pulse generation circuit included in the counting signal generation circuit shown in FIG. 4.

Referring to FIG. 5, the pulse generation circuit 125 in accordance with an embodiment may include an internal pulse signal generation circuit 1251 and a logic circuit 1252.

The internal pulse signal generation circuit 1251 may be realized by a delay D11 and an AND gate AD11, and generate an internal pulse signal IP including a pulse which is generated for a predetermined period from a time point when the pre-counting signal PCNT is inputted.

The logic circuit 1252 may be realized by an AND gate AD12, and output the internal pulse signal IP as the second counting signal CNT<2> if the self-refresh command SREF is inputted at the logic high level.

Figure 6:
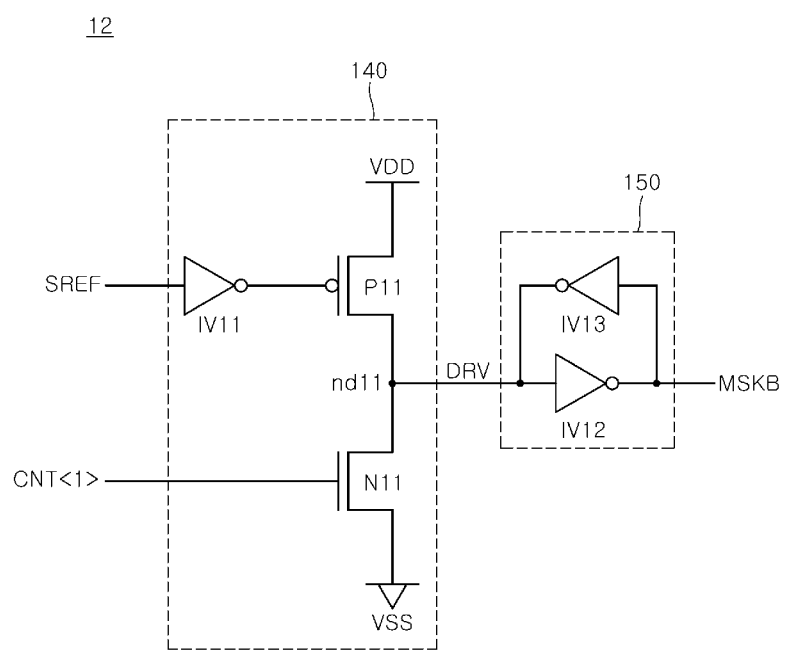
FIG. 6 is a block diagram illustrating a representation of an example internal configuration of a masking signal generation circuit included in the semiconductor system shown in FIG. 1.

Referring to FIG. 6, the masking signal generation circuit 12 in accordance with an embodiment may include a driving signal generation circuit 140 and a latch circuit 150.

The driving signal generation circuit 140 may generate a driving signal DRV which is enabled to a logic high level when the self-refresh command SREF is inputted and is disabled to a logic low level when the first counting signal CNT<1> is inputted.

In detail, the driving signal generation circuit 140 may include an inverter IV11 which inverts and buffers the self-refresh command SREF, a PMOS transistor P11 which is positioned between a power supply voltage VDD and an internal node nd11 and pull-up drives the internal node nd11 in response to the output signal of the inverter IV11, and an NMOS transistor N11 which is positioned between the internal node nd11 and a ground voltage VSS and pull-down drives the internal node nd11 in response to the first counting signal CNT<1>. The driving signal generation circuit 140 may pull-up drive the internal node nd11 if the self-refresh command SREF is inputted at the logic high level, and generate the driving signal DRV of the logic high level. The driving signal generation circuit 140 may pull-down drive the internal node nd11 if the first counting signal CNT<1> is inputted at a logic high level, and generate the driving signal DRV of the logic low level.

The latch circuit 150 may latch the driving signal DRV, invert and buffer the latched driving signal DRV, and output the latched driving signal DRV as the masking signal MSKB. The latch circuit 150 may be realized by a general latch which is realized by inverters IV12 and IV13.

Figure 7:
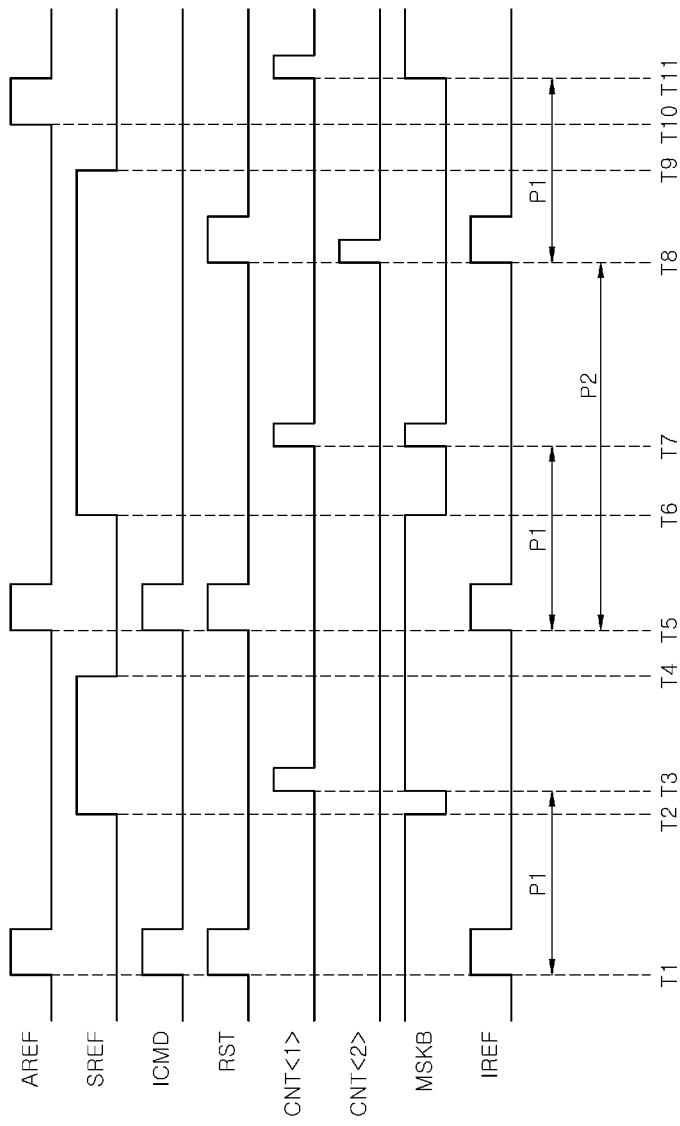
FIG. 7 is a representation of an example timing diagram to assist in the explanation of the operation of the semiconductor system in accordance with an embodiment.

The auto-refresh operation and the self-refresh operation in the operation of the semiconductor system in accordance with an embodiment will be exemplarily described with reference to FIG. 7, by being divided into the auto-refresh operation, an operation in which the internal refresh operation is not performed when entering the self-refresh mode and an operation in which input of the auto-refresh command is cut off when exiting the self-refresh mode.

First, the auto-refresh operation of the semiconductor system in accordance with an embodiment will be described below.

At time T1, the first semiconductor device 1 outputs the auto-refresh command AREF and the first to fourth temperature information signals TPI<1:4>.

The command input circuit 20 transfers the auto-refresh command AREF as the internal command ICMD in response to the masking signal MSKB.

The reset signal generation circuit 130 generates the reset signal RST which is enabled to the logic high level in response to the internal command ICMD.

The selection signal generation circuit 110 generates the selection signal SEL which is adjusted in the pulse generation period thereof according to the first to fourth temperature information signals TPI<1:4>.

In response to the selection signal SEL, the counting signal generation circuit 120 generates the first counting signal CNT<1> of a logic low level since a first predetermined period P1 does not pass from the input time of the reset signal RST, and the counting signal generation circuit 120 generates the second counting signal CNT<2> of a logic low level since a second predetermined period P2 does not pass from the input time of the reset signal RST.

The internal refresh signal generation circuit 30 generates the internal refresh signal IREF which is enabled to a logic high level, where the internal refresh signal generation circuit 30 generates the internal refresh signal IREF in response to the reset signal RST of the logic high level.

The internal circuit 40 performs the auto-refresh operation in response to the internal refresh signal IREF of the logic high level.

Next, the operation of cutting off performance of the internal refresh operation when entering the self-refresh mode in the semiconductor system in accordance with an embodiment will be described below.

From a time T2 to time T4, the first semiconductor device 1 outputs the self-refresh command SREF and the first to fourth temperature information signals TPI<1:4>.

The selection signal generation circuit 110 generates the selection signal SEL which is adjusted in the pulse generation period thereof according to the first to fourth temperature information signals TPI<1:4>.

In response to receiving the selection signal SEL, the counting signal generation circuit 120 generates the first counting signal CNT<1> of the logic low level because the first predetermined period P1 does not pass from the input time of the reset signal RST, and the counting signal generation circuit 120 generates the second counting signal CNT<2> of the logic low level because the second predetermined period P2 does not pass from the input time of the reset signal RST.

The reset signal generation circuit 130 generates the reset signal RST which is disabled to a logic low level, in response to the second counting signal CNT<2> of the logic low level.

The driving signal generation circuit 140 generates the driving signal DRV of the logic high level in response to the self-refresh command SREF of the logic high level.

The latch circuit 150 latches the driving signal DRV, inverts and buffers the latched driving signal DRV, and outputs the masking signal MSKB of a logic low level.

At the time T3, the counting signal generation circuit 120 generates the first counting signal CNT<1> of the logic high level in response to the selection signal SEL because the first predetermined period P1 passes from the point of time T1 being the input time of the reset signal RST.

The driving signal generation circuit 140 generates the driving signal DRV of the logic low level in response to the first counting signal CNT<1> of the logic high level.

The latch circuit 150 latches the driving signal DRV, inverts and buffers the latched driving signal DRV, and outputs the masking signal MSKB of the logic high level.

At the time T4, the counting signal generation circuit 120 generates the second counting signal CNT<2> of the logic low level in response to the selection signal SEL because the second predetermined period P2 does not pass from the point of time T1 being the input time of the reset signal RST.

At this time, the internal refresh signal generation circuit 30 generates the internal refresh signal IREF which is disabled to a logic low level, in response to the second counting signal CNT<2> of the logic low level.

The internal circuit 40 does not perform the internal refresh operation in response to the internal refresh signal IREF of the logic low level.

In this way, the semiconductor system in accordance with an embodiment may not perform the internal refresh operation during a predetermined period when entering the self-refresh mode.

Next, not performing the internal refresh operation and performing the internal refresh operation if a predetermined period passes, after the auto-refresh operation of the semiconductor system in accordance with the embodiment, will be described below.

At a time T5, the first semiconductor device 1 outputs the auto-refresh command AREF and the first to fourth temperature information signals TPI<1:4>.

The command input circuit 20 transfers the auto-refresh command AREF as the internal command ICMD in response to the masking signal MSKB.

The reset signal generation circuit 130 generates the reset signal RST which is enabled to the logic high level, in response to the internal command ICMD.

The selection signal generation circuit 110 generates the selection signal SEL which is adjusted in the pulse generation period thereof according to the first to fourth temperature information signals TPI<1:4>.

In response to the selection signal SEL, the counting signal generation circuit 120 generates the first counting signal CNT<1> of the logic low level because the first predetermined period P1 does not pass from the input time of the reset signal RST, and the counting signal generation circuit 120 generates the second counting signal CNT<2> of the logic low level because the second predetermined period P2 does not pass from the input time of the reset signal RST.

The internal refresh signal generation circuit 30 generates the internal refresh signal IREF which is enabled to the logic high level, in response to the reset signal RST of the logic high level.

The internal circuit 40 performs the auto-refresh operation in response to the internal refresh signal IREF of the logic high level.

From a time T6 to a time T9, the first semiconductor device 1 outputs the self-refresh command SREF and the first to fourth temperature information signals TPI<1:4>.

At the time T6, the selection signal generation circuit 110 generates the selection signal SEL which is adjusted in the pulse generation period thereof according to the first to fourth temperature information signals TPI<1:4>.

In response to the selection signal SEL, the counting signal generation circuit 120 generates the first counting signal CNT<1> of the logic low level because the first predetermined period P1 does not pass from the time T5 being the input time of the reset signal RST, and the counting signal generation circuit 120 generates the second counting signal CNT<2> of the logic low level because the second predetermined period P2 does not pass from the time T5 being the input time of the reset signal RST.

The reset signal generation circuit 130 generates the reset signal RST in response to the second counting signal CNT<2> of the logic low level. The reset signal generation circuit 130 may generate the reset signal RST disabled to the logic low level.

The driving signal generation circuit 140 generates the driving signal DRV of the logic high level in response to the self-refresh command SREF of the logic high level.

The latch circuit 150 latches the driving signal DRV, inverts and buffers the latched driving signal DRV, and outputs the masking signal MSKB of the logic low level.

At the time T7, the counting signal generation circuit 120 generates the first counting signal CNT<1> of the logic high level in response to the selection signal SEL because the first predetermined period P1 passes from the time T5 being the input time of the reset signal RST.

The driving signal generation circuit 140 generates the driving signal DRV of the logic low level in response to the first counting signal CNT<1> of the logic high level.

The latch circuit 150 latches the driving signal DRV, inverts and buffers the latched driving signal DRV, and outputs the masking signal MSKB of the logic high level.

At the time T8, the counting signal generation circuit 120 generates the second counting signal CNT<2> of the logic high level in response to the selection signal SEL because the second predetermined period P2 passes from the time T5 being the input time of the reset signal RST.

After the second predetermined period P2 passes when entering the self-refresh mode, the internal refresh signal generation circuit 30 generates the internal refresh signal IREF which is enabled to the logic high level, in response to the second counting signal CNT<2> of the logic high level.

The internal circuit 40 performs the internal refresh operation in response to the internal refresh signal IREF of the logic high level.

In this way, the semiconductor system in accordance with an embodiment does not perform the internal refresh operation during a predetermined period when entering the self-refresh mode, and performs the internal refresh operation if the predetermined period passes.

Next, the operation of cutting off input of the auto-refresh command when exiting the self-refresh mode in the semiconductor system in accordance with an embodiment will be described below.

At a time T10, the first semiconductor device 1 outputs the auto-refresh command AREF and the first to fourth temperature information signals TPI<1:4>.

The command input circuit 20 cuts off input of the auto-refresh command AREF in response to the masking signal MSKB of the logic low level, and generates the internal command ICMD of a logic low level.

The reset signal generation circuit 130 generates the reset signal RST which is disabled to the logic low level, in response to the internal command ICMD.

The selection signal generation circuit 110 generates the selection signal SEL which is adjusted in the pulse generation period thereof according to the first to fourth temperature information signals TPI<1:4>.

In response to the selection signal SEL, the counting signal generation circuit 120 generates the first counting signal CNT<1> of the logic low level because the first predetermined period P1 does not pass from the time T8 being the input time of the reset signal RST, and the counting signal generation circuit 120 generates the second counting signal CNT<2> of the logic low level because the second predetermined period P2 does not pass from the time T8 being the input time of the reset signal RST.

The internal refresh signal generation circuit 30 generates the internal refresh signal IREF which is disabled to the logic low level, in response to the reset signal RST of the logic low level and the second counting signal CNT<2> of the logic low level.

The internal circuit 40 does not perform the auto-refresh operation in response to the internal refresh signal IREF of the logic low level.

At a time T11, in response to the selection signal SEL, the counting signal generation circuit 120 generates the first counting signal CNT<1> of the logic high level since the first predetermined period P1 passes from the time T8 being the input time of the reset signal RST, and the counting signal generation circuit 120 generates the second counting signal CNT<2> of the logic low level since the second predetermined period P2 does not pass from the time T8 being the input time of the reset signal RST.

The driving signal generation circuit 140 generates the driving signal DRV of the logic low level in response to the first counting signal CNT<1> of the logic high level.

The latch circuit 150 latches the driving signal DRV, inverts and buffers the latched driving signal DRV, and outputs the masking signal MSKB of the logic high level.

After the time T11, the command input circuit 20 may transfer the auto-refresh command AREF as the internal command ICMD in response to the masking signal MSKB of the logic high level.

In this way, the semiconductor system in accordance with the embodiment cuts off input of the auto-refresh command during a predetermined period when exiting the self-refresh mode.

As is apparent from the above descriptions, in the semiconductor system in accordance with an embodiment, an internal refresh operation is not performed when entering a self-refresh mode, and input of a refresh command is cut off when exiting the self-refresh mode. As a consequence, since an unnecessary refresh operation is not performed, and power consumption may be reduced.

Figure 8:
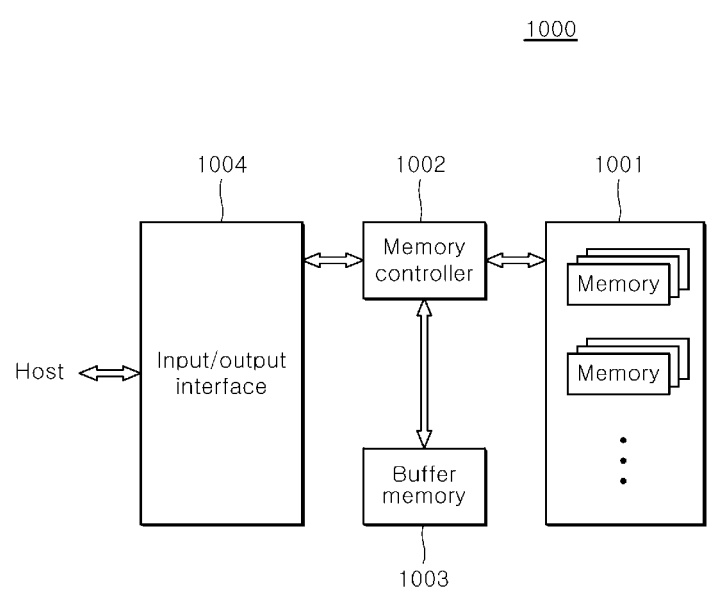
FIG. 8 is a diagram illustrating a representation of an example configuration of an electronic system to which semiconductor devices and the semiconductor system shown in FIGS. 1 to 7 are applied.

The semiconductor device and the semiconductor system described above with reference to FIGS. 1 to 7 may be applied to an electronic system which includes a memory system, a graphic system, a computing system or a mobile system. For example, referring to FIG. 8, an electronic system 1000 in accordance with an embodiment may include a data storage 1001, a memory controller 1002, a buffer memory 1003, and an input/output interface 1004.

The data storage 1001 stores data applied from the memory controller 1002, and reads out stored data and outputs the read-out data to the memory controller 1002, according to control signals from the memory controller 1002. The data storage 1001 may include the second semiconductor device 2 shown in FIG. 1. The data storage 1001 may include a nonvolatile memory capable of not losing and continuously storing data even though power supply is interrupted. A nonvolatile memory may be realized as a flash memory such as a NOR flash memory and a NAND flash memory, a phase change random access memory (PRAM), a resistive random access memory (RRAM), a spin transfer torque random access memory (STTRAM), or a magnetic random access memory (MRAM).

The memory controller 1002 decodes commands applied through the input/output interface 1004 from an external device (a host), and controls input/output of data with respect to the data storage 1001 and the buffer memory 1003 according to decoding results. The memory controller 1002 may include the first semiconductor device 1 shown in FIG. 1. While the memory controller 1002 is illustrated as one block in FIG. 8, in the memory controller 1002, a controller for controlling the nonvolatile memory and a controller for controlling the buffer memory 1003 as a volatile memory may be independently configured.

The buffer memory 1003 may temporarily store data to be processed in the memory controller 1002, that is, data to be inputted and outputted to and from the data storage 1001. The buffer memory 1003 may store data applied from the memory controller 1002 according to a control signal. The buffer memory 1003 reads out stored data and outputs the read-out data to the memory controller 1002. The buffer memory 1003 may include a volatile memory such as a DRAM (dynamic random access memory), a mobile DRAM, and an SRAM (static random access memory).

The input/output interface 1004 provides a physical coupling between the memory controller 1002 and the external device (the host) such that the memory controller 1002 may receive control signals for input/output of data from the external device and exchange data with the external device. The input/output interface 1004 may include one among various interface protocols such as universal serial bus (USB), multimedia card (MMC), peripheral component interconnect express (PCI-E), small computer system interface (SCSI), serial attached SCSI (SAS), serial advanced technology attachment (SATA), parallel advanced technology attachment (PATA), enhanced small device interface (ESDI), and integrated drive electronics (IDE).

The electronic system 1000 may be used as an auxiliary memory device or an external storage device of the host. The electronic system 1000 may include a solid state disk (SSD), a USB memory, a secure digital (SD) card, a mini-secure digital (mSD) card, a micro SD card, a secure digital high capacity (SDHC) card, a memory stick card, a smart media (SM) card, an MMC, an embedded MMC (eMMC), or a compact flash (CF) card.

While various embodiments have been described above, it will be understood to those skilled in the art that the embodiments described are by way of example only. Accordingly, the semiconductor device and the semiconductor system described herein should not be limited based on the described embodiments.

What is claimed is:

1. A semiconductor system comprising:

a semiconductor device suitable for not performing an internal refresh operation when entering a self-refresh mode in response to a self-refresh command, and cutting off input of an auto-refresh command when exiting the self-refresh mode, wherein the semiconductor device comprises:

a refresh control circuit suitable for generating a first counting signal which is enabled after a first predetermined period and generating a second counting signal which is enabled after a second predetermined period, in response to temperature information signals, and generating a masking signal which is enabled at a time point when the first counting signal is enabled;

a command input circuit suitable for transferring the auto-refresh command as an internal command or cutting off input of the auto-refresh command in response to the masking signal;

an internal refresh signal generation circuit suitable for generating an enabled internal refresh signal in response to a reset signal or the second counting signal; and an internal circuit suitable for performing the internal refresh operation or the auto-refresh operation in response to the internal refresh signal.

2. The semiconductor system according to claim 1, wherein the semiconductor device cuts off input of the auto-refresh command for the first predetermined period when exiting the self-refresh mode, and performs the internal refresh operation after the second predetermined period when entering the self-refresh mode.

3. The semiconductor system according to claim 1, wherein the semiconductor device performs an auto-refresh operation by being inputted with the auto-refresh command after the first predetermined period when exiting the self-refresh mode.

4. The semiconductor system according to claim 1, wherein the refresh control circuit comprises: a counter control circuit suitable for generating the first counting signal which is enabled after the first predetermined period from an input time of the reset signal, and generating the second counting signal which is enabled after the second predetermined period from the input time of the reset signal; and a masking signal generation circuit suitable for generating the masking signal which is disabled in response to the self-refresh command and is enabled in response to the first counting signal.

5. The semiconductor system according to claim 4, wherein the counter control circuit comprises:
- a selection signal generation circuit suitable for generating a selection signal of which pulse generation period is adjusted according to the temperature information signals;
- a counting signal generation circuit suitable for generating the first counting signal which is enabled after the first predetermined period from the input time of the reset signal and generating the second counting signal which is enabled after the second predetermined period from the input time of the reset signal, in response to the selection signal; and
- a reset signal generation circuit suitable for generating the reset signal which is enabled in response to the internal command or the second counting signal.

6. The semiconductor system according to claim 5, wherein the selection signal generation circuit comprises:
- an oscillator suitable for generating a period signal including a pulse which is generated periodically;
- an internal period signal generation circuit suitable for generating a plurality of internal period signals which have different frequencies, in response to the period signal; and
- a multiplexer suitable for outputting any one of the plurality of internal period signals, as the selection signal, in response to the temperature information signals.

7. The semiconductor system according to claim 5, wherein the counting signal generation circuit comprises:
- a first counter suitable for generating a first internal counting signal which is initialized in response to the reset signal and is counted in response to the selection signal;
- a second counter suitable for generating the first counting signal which is initialized in response to the reset signal and is counted in response to the first internal counting signal;
- a third counter suitable for generating a second internal counting signal which is initialized in response to the reset signal and is counted in response to the first counting signal;
- a fourth counter suitable for generating a pre-counting signal which is initialized in response to the reset signal and is counted in response to the second internal counting signal; and
- a pulse generation circuit suitable for generating the second counting signal which is enabled in response to the self-refresh command and the pre-counting signal.

8. The semiconductor system according to claim 7, wherein the pulse generation circuit comprises:
- an internal pulse signal generation circuit suitable for generating an internal pulse signal including a pulse which is generated for a predetermined period from a time point when the pre-counting signal is inputted; and
- a logic circuit suitable for outputting the internal pulse signal as the second counting signal if the self-refresh command is inputted.

9. The semiconductor system according to claim 7, wherein the first predetermined period is a period from a time when the first and second counters are initialized to a time when the first counting signal is enabled by counting operations of the first and second counters, and the second predetermined period is a period from a time when the first to fourth counters are initialized to a time when the pre-counting signal is enabled by counting operations of the first to fourth counters.

10. The semiconductor system according to claim 4, wherein the masking signal generation circuit comprises:
- a driving signal generation circuit suitable for generating a driving signal which is enabled when the self-refresh command is inputted and is disabled when the first counting signal is inputted; and
- a latch circuit suitable for latching the driving signal and outputting the latched driving signal as the masking signal.

* * * * *